United States Patent
Dalisda et al.

(10) Patent No.: US 9,444,420 B2
(45) Date of Patent: Sep. 13, 2016

(54) DOHERTY AMPLIFIER WITH EFFICIENCY OPTIMIZATION

(75) Inventors: Uwe Dalisda, Fuerstenfeldbruck (DE); Peter Mühlbacher, Geisenfeld (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 58 days.

(21) Appl. No.: 14/116,994

(22) PCT Filed: Jun. 29, 2012

(86) PCT No.: PCT/EP2012/062692
§ 371 (c)(1),
(2), (4) Date: Nov. 11, 2013

(87) PCT Pub. No.: WO2013/001059
PCT Pub. Date: Jan. 3, 2013

(65) Prior Publication Data
US 2014/0085000 A1 Mar. 27, 2014

(30) Foreign Application Priority Data

Jun. 30, 2011 (DE) .......................... 10 2011 078 410
Jul. 22, 2011 (DE) .......................... 10 2011 079 613

(51) Int. Cl.
*H03F 3/68* (2006.01)
*H03F 1/02* (2006.01)

(52) U.S. Cl.
CPC *H03F 3/68* (2013.01); *H03F 1/02* (2013.01); *H03F 1/0288* (2013.01)

(58) Field of Classification Search
USPC .......................... 330/124 R, 295, 286, 53, 84
See application file for complete search history.

(56) References Cited

U.S. PATENT DOCUMENTS

| | | | |
|---|---|---|---|
| 6,285,251 B1 | 9/2001 | Dent | |
| 6,396,341 B1 | 5/2002 | Pehlke | |
| 7,391,259 B2* | 6/2008 | Parker et al. | .................... 330/84 |
| 7,518,448 B1* | 4/2009 | Blair et al. | ................. 330/124 R |
| 7,619,468 B1* | 11/2009 | Bowles | ................. H03F 1/0266 |
| | | | 330/124 R |

(Continued)

FOREIGN PATENT DOCUMENTS

| | | |
|---|---|---|
| EP | 1 758 242 A1 | 2/2007 |
| EP | 1 609 239 B1 | 7/2010 |

(Continued)

OTHER PUBLICATIONS

International Search Report mailed Jan. 21, 2013, issued in the corresponding International Application No. PCT/EP2012/062692, filed Jun. 29, 2012, 7 pages.

(Continued)

*Primary Examiner* — Hieu Nguyen
(74) *Attorney, Agent, or Firm* — Christensen O'Connor Johnson Kindness PLLC

(57) ABSTRACT

An amplifier comprises a main-amplifier circuit, an auxiliary-amplifier circuit and a signal-generating device. Output terminals of the main-amplifier circuit and of the auxiliary-amplifier circuit are connected according to the Doherty principle. The signal-generating device is configured to generate directly a main-amplifier signal as an input signal of the main-amplifier circuit and an auxiliary-amplifier signal as an input signal of the auxiliary-amplifier circuit.

10 Claims, 4 Drawing Sheets

(56) References Cited

U.S. PATENT DOCUMENTS

Figure 1:
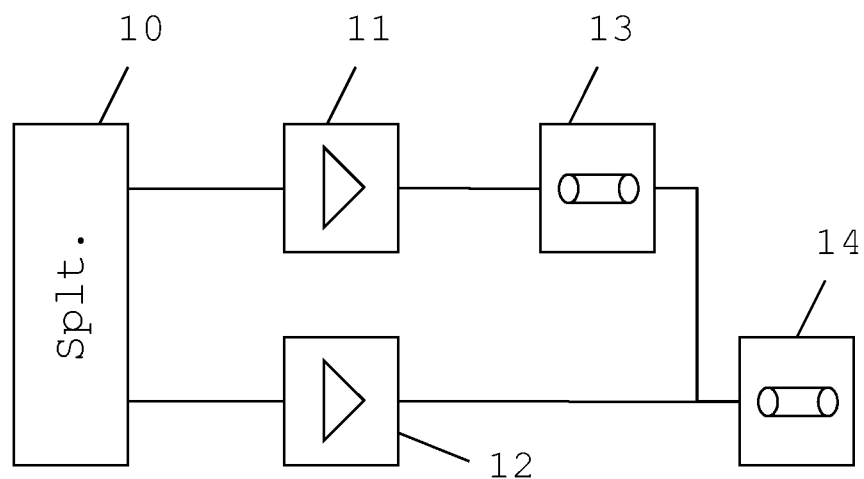

| | | | |
|---|---|---|---|
| 8,274,332 B2 * | 9/2012 | Cho et al. | 330/295 |
| 8,314,654 B2 * | 11/2012 | Outaleb et al. | 330/124 R |
| 8,710,924 B2 * | 4/2014 | van der Zanden et al. | 330/124 R |
| 2004/0113698 A1 | 6/2004 | Kim | |
| 2006/0293011 A1 | 12/2006 | Park | |
| 2007/0008032 A1 | 1/2007 | Kyu | |
| 2007/0298736 A1 | 12/2007 | Fujioka | |
| 2008/0111622 A1 | 5/2008 | Sperlich | |
| 2008/0122542 A1 | 5/2008 | Bowles | |
| 2008/0238544 A1 | 10/2008 | Morris | |

FOREIGN PATENT DOCUMENTS

| | | |
|---|---|---|
| WO | 01/03289 A1 | 1/2001 |
| WO | 01/95480 A1 | 12/2001 |
| WO | 2008/013481 A1 | 1/2008 |
| WO | 2008/042709 A2 | 4/2008 |

OTHER PUBLICATIONS

International Preliminary Report on Patentability and Written Opinion mailed Jan. 7, 2014, issued in the corresponding International Application No. PCT/EP2012/062692, filed Jun. 29, 2012, 14 pages.

* cited by examiner

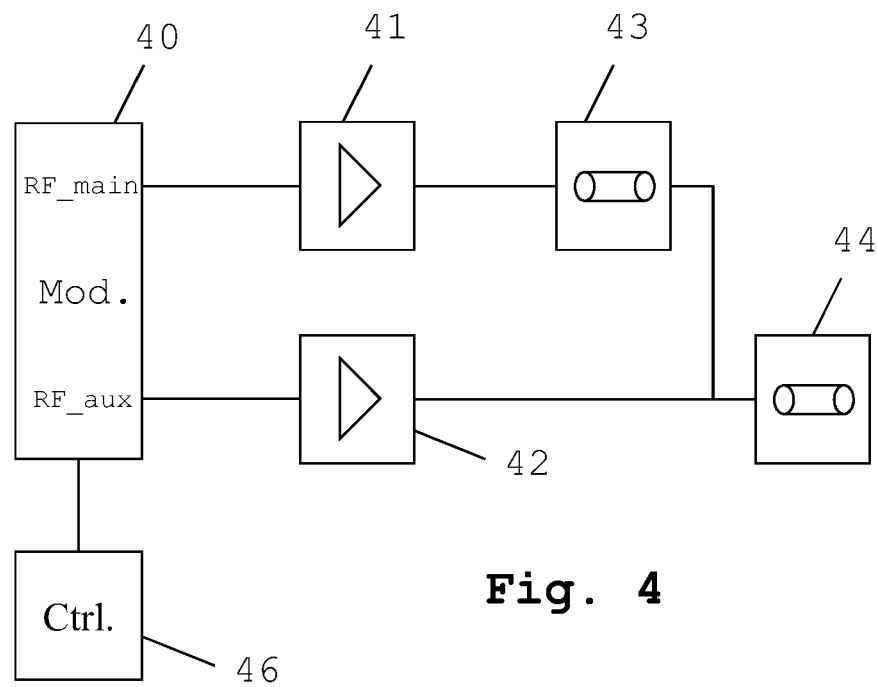
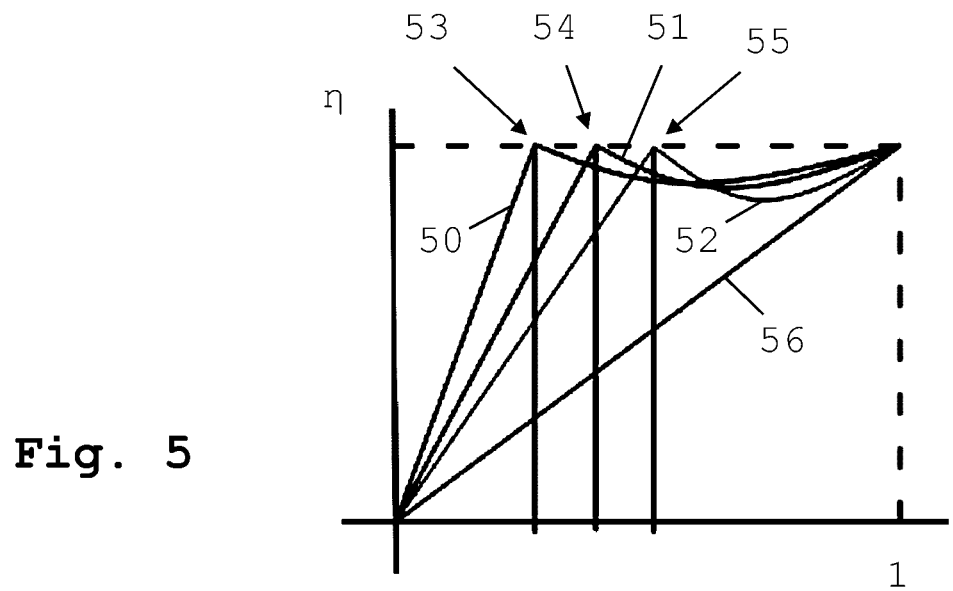
Fig. 4
Fig. 5

DOHERTY AMPLIFIER WITH EFFICIENCY OPTIMIZATION

The invention relates to an amplifier, especially a Doherty amplifier.

Doherty amplifiers conventionally comprise two amplifier branches, a main-amplifier and an auxiliary-amplifier. The two outputs of the main-amplifier and the auxiliary-amplifier are combined via a λ/4 line in the main-amplifier branch. Accordingly, the load impedance on the main-amplifier and the auxiliary-amplifier is transformed dynamically, which leads to an increase in efficiency. In this context, the input signal to be amplified is supplied via a signal splitter to the main-amplifier and the auxiliary-amplifier. The phase shifting of the divided input signals for the main-amplifier and auxiliary-amplifier is 90° in order to compensate the phase shifting in the main-amplifier branch through the necessary λ/4 line transformation disposed at the output.

Such a Doherty amplifier is known from European Patent EP 1 609 239 B1. The disadvantage with the known Doherty amplifier is that, as a result of the signal splitting and tolerances of the individual amplifiers, an optimal signal division between the main-amplifier and auxiliary-amplifier does not take place. This leads to reduced efficiency.

The invention is based upon the object of providing an amplifier which achieves a high efficiency.

The object is achieved according to the invention by an amplifier with the features of the independent claim 1. Advantageous further developments form the subject matter of the dependent claims relating back to claim 1.

An amplifier according to the invention comprises a main-amplifier circuit, an auxiliary-amplifier circuit and a signal-generating device. Output terminals of the main-amplifier circuit and the auxiliary-amplifier circuit are connected according to the Doherty principle. The signal-generating device is embodied to generate directly a main-amplifier signal as an input signal of the main-amplifier circuit and an auxiliary-amplifier signal as an input signal of the auxiliary-amplifier circuit. An amplifier with a very high efficiency is achieved in this manner.

Figure 2:
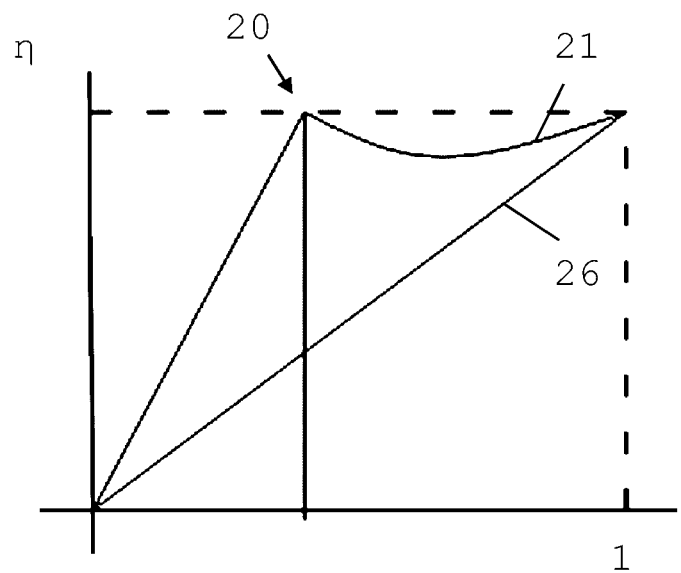
Figure 3:
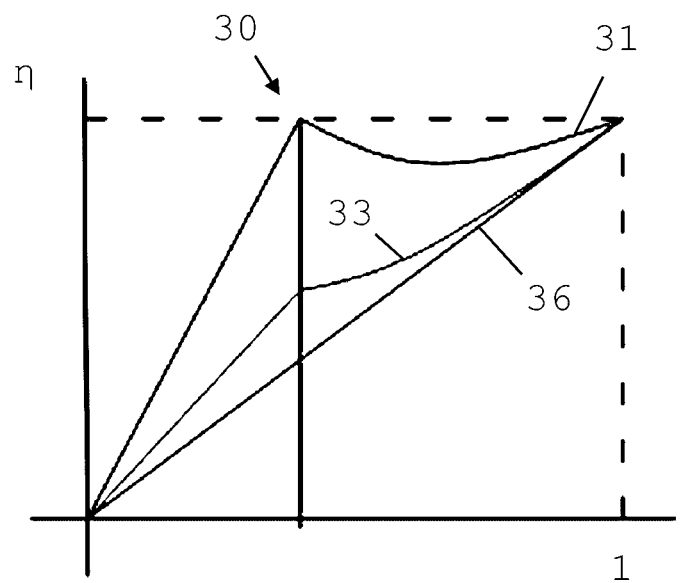
Figure 6:
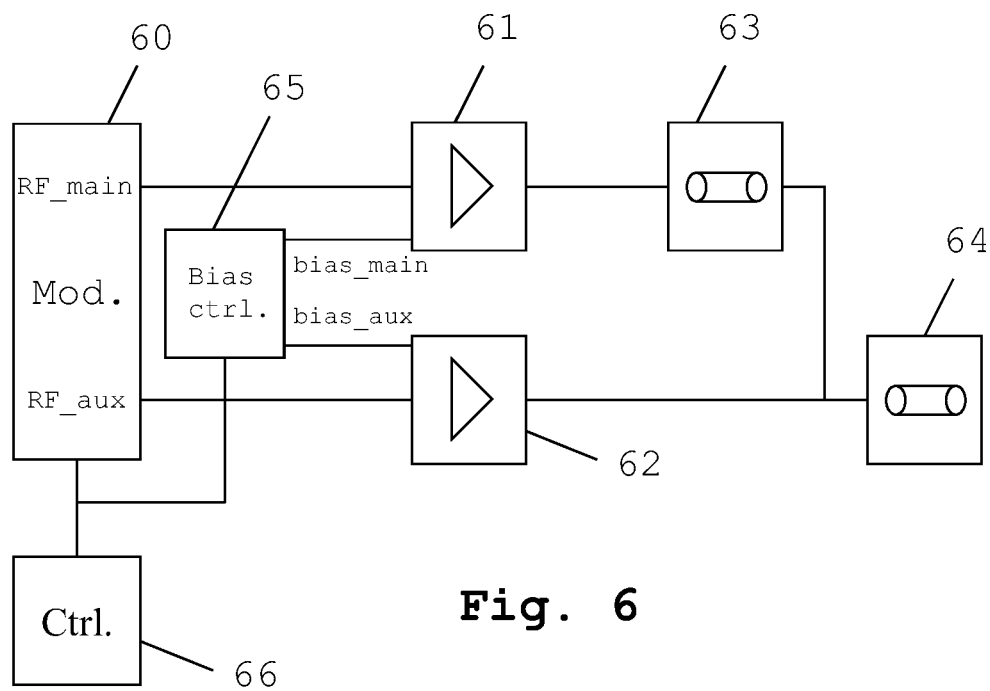
Figure 7:
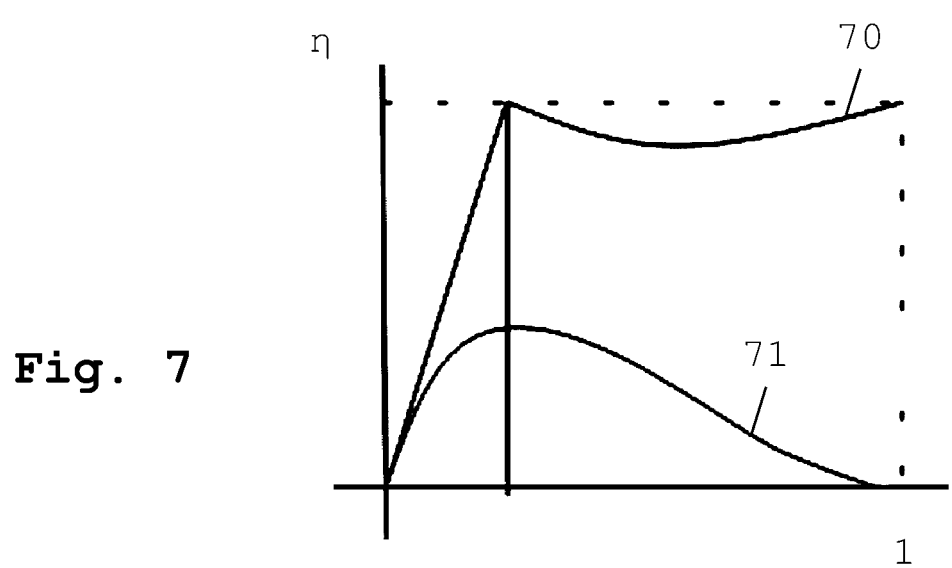

The invention is described by way of example on the basis of the drawings in which an advantageous exemplary embodiment of the invention is illustrated. The drawings show:

FIG. 1 an exemplary Doherty amplifier;

FIG. 2 a first exemplary efficiency curve;

FIG. 3 a second exemplary efficiency curve;

FIG. 4 a first exemplary embodiment of the amplifier according to the invention;

FIG. 5 a first efficiency curve in the case of an exemplary embodiment of the amplifier according to the invention;

FIG. 6 a second exemplary embodiment of the amplifier according to the invention; and FIG. 7 a second efficiency curve in the case of an exemplary embodiment of the amplifier according to the invention.

The problem underlying the present invention will first be explained with reference to FIGS. 1 to 3. The structure and functioning of various exemplary embodiments of the amplifier according to the invention will then be shown with reference to FIGS. 4 to 7. The presentation and description of identical elements in similar drawings have not been repeated in some cases.

FIG. 1 shows an exemplary Doherty amplifier. A signal splitter 10 is connected to a main-amplifier circuit 11 and an auxiliary-amplifier circuit 12. The main-amplifier circuit 11 is further connected to a λ/4 line 13. The auxiliary-amplifier circuit 12 and the λ/4 line 13 are connected to a further λ/4 line 14.

An input signal to be amplified is supplied to the signal splitter 10. The latter divides it into a main-amplifier signal and an auxiliary-amplifier signal. The main-amplifier signal and the auxiliary-amplifier signal here provide a 90° phase offset. The main-amplifier signal corresponds to the signal to be amplified. In this context, the auxiliary-amplifier signal corresponds to these signal peaks. The main-amplifier circuit 11 amplifies the main-amplifier signal, while the auxiliary-amplifier circuit 12 amplifies the auxiliary-amplifier signal.

The λ/4 line 13 in the main-amplifier path implements a line transformation. As a result, a dynamic transformation of the load impedance takes place in such a manner that the main-amplifier circuit 11 goes into saturation at a threshold value, conventionally 6 dB. With a further increase of power, the auxiliary-amplifier circuit also makes a contribution to the output power, which leads to the dynamic reduction of the load impedance for the main-amplifier circuit 11. When driven at full power, each of the amplifiers supplies 50% of the total power.

The theoretical efficiency curve 21 shown in FIG. 2 is obtained for the Doherty amplifier according to FIG. 1. With the adjusted threshold value 20, the main-amplifier circuit goes into saturation. Up to this point, the auxiliary-amplifier circuit does not make a contribution to the output power. By way of comparison, the efficiency curve 26 of a class B amplifier is additionally shown here.

An optimal splitting of the signal between the main-amplifier circuit and the auxiliary-amplifier circuit cannot be achieved because of the signal splitting at the input, the tolerances of the individual amplifiers, different bias-current settings of the amplifiers etc. The auxiliary-amplifier circuit already supplies a part of the power, although the main-amplifier circuit is not yet in saturation.

Accordingly, the peak efficiency in the region of the threshold value is not achieved reliably. This is illustrated in FIG. 3. The efficiency curve 31 corresponds to the efficiency curve 21 from FIG. 2. A real, releasable efficiency curve 33 is additionally shown. Furthermore, the efficiency curve 36 of a conventional class B amplifier is shown by way of comparison. However, by contrast with this class B amplifier, the efficiency curve 33 of the real Doherty amplifier still continues to achieve a significantly higher mean efficiency.

FIG. 4 shows a first exemplary embodiment of the amplifier according to the invention. A signal-generating device 40 is connected to a main-amplifier circuit 41 and an auxiliary-amplifier circuit 42. The main-amplifier circuit 41 is further connected to a λ/4 line 43. The λ/4 line 43 and the auxiliary-amplifier circuit 42 are connected to a further λ/4 line 44. The signal-generating device 40 is further connected to the control device 46.

Instead of splitting an analog signal to be amplified into a main-amplifier signal and an auxiliary-amplifier signal, as implemented with the signal splitter 10 from FIG. 1, in this context, a main-amplifier signal and an auxiliary-amplifier signal are generated by the signal-generating device 40. Accordingly, the signals can be generated from digital signals to be amplified. The signal generation is advantageously implemented directly here. The signal-generating device is advantageously a modulation device or a control transmitter. The main-amplifier signal and the auxiliary-amplifier signal here are already generated by the signal-generating device 40 with a 90° phase offset.

The control device 46 controls the signal-generating device 40. Accordingly, it adjusts the threshold value, at which the signal-generating device 40 splits the signal to be amplified into the main-amplifier signal and the auxiliary-amplifier signal. Dependent upon this threshold value, the control device 46 can therefore adjust different efficiency curves. This will be described in greater detail on the basis of FIG. 5.

FIG. 5 shows several efficiency curves 50, 51, 52 resulting from several different threshold values 53, 54, 55. By adjusting these threshold values 53, 54, 55, the control device 46 from FIG. 4 also simultaneously adjusts the respective efficiency curves 50, 51, 52. The efficiency curve 56 of a conventional class B amplifier is additionally plotted here for comparison.

By dispensing with an analog signal splitter, a significant improvement in efficiency is therefore achieved. The attainable efficiency curves 50, 51, 52 are disposed close to the maximum theoretically attainable efficiency curve. Moreover, adjusting the threshold value also allows an optimisation of the signal currently to be amplified. Accordingly, an efficiency curve 50 could be adjusted for signals with very high peak values by comparison with the mean-signal value, for example, 9-12 dB, preferably 10 dB. In the case of signals with high peak values by comparison with the mean signal value, for example, 7-9 dB, preferably 8 dB, an efficiency curve 51 could be adjusted. In the case of signals with lower peak values by comparison with the mean signal value, for example, 5-7 dB, preferably 6 dB, an efficiency curve 52 could be adjusted.

FIG. 6 shows a second exemplary embodiment of the amplifier according to the invention. The illustrated amplifier corresponds largely to the amplifier from FIG. 4. The reference numbers 60-64 and 66 correspond to the reference numbers 40-44 and 46 from FIG. 4. Additionally, the amplifier shown here contains a bias-current generating device 65. The latter is connected to the control device 66, the main-amplifier circuit 61 and the auxiliary-amplifier circuit 62. In this context, the bias-current generating device 65 generates the bias current bias_main of the main-amplifier circuit 61 and the bias current bias_aux of the auxiliary-amplifier circuit 62. The generation of the bias currents bias_main and bias_aux is implemented here dependent upon the required threshold value for the signal splitting. The determination of the bias currents bias_main and bias_aux to be generated is also implemented by the control device 66. A further approximation of the efficiency curve to the maximum theoretically attainable efficiency curve is achieved in this manner.

The amplifier shown in FIG. 4 and FIG. 6 is particularly advantageous for the amplification of signals with digital modulation (for example, QAM-OFDM, COFDM, etc.). These digital modulation types are used in many applications. DVB-T, DVB-H, DVB-T2, MediaFlo, ISDB-T, ATSC, CMMB, CDMA, WCDMA, GSM etc. are mentioned here by way of example. These modulation types provide different crest factors or respectively different signal statistics. The signal statistic of these signals is either known or can be measured or calculated in the case of a signal generation. The main-amplifier signal and the auxiliary-amplifier signal can now be calculated in such a manner that the point with the highest peak efficiency is tuned optimally to the signal statistic, in order to achieve a maximal overall efficiency of the amplifier arrangement in this manner. This is shown in FIG. 7. Accordingly, the curve 71 shows a statistical amplitude distribution of a modulation method used. The efficiency curve 70, which is adjusted by the control device 46 or respectively 66 from FIG. 4 or FIG. 6 maximises the average overall efficiency of the transmission symbols to be broadcast.

A slight further improvement of the average efficiency can be achieved through a continuous monitoring of the statistic of the signal to be broadcast and a matching of the efficiency curve to be adjusted.

The invention is not restricted to the exemplary embodiment illustrated. Alongside the modulation methods already mentioned, other transmission methods are also conceivable. All of the features described above or illustrated in the figures can be advantageously combined with one another as required within the framework of the invention.

The invention claimed is:

1. An amplifier comprising:
a main-amplifier circuit;
an auxiliary-amplifier circuit, whereas the output terminals of the main-amplifier circuit and the auxiliary-amplifier circuit are connected according to the Doherty principle;
a signal-generating device configured to generate directly a main-amplifier signal as an input signal of the main-amplifier circuit and an auxiliary-amplifier signal as an input signal of the auxiliary-amplifier circuit; and
a control device configured to control the signal-generating device, wherein the control device is configured to determine a threshold value on the basis of the signal to be amplified in order to determine the main-amplifier signal and the auxiliary-amplifier signal, and wherein the control device is configured to adjust the threshold value in an efficiency-optimizing manner on the basis of a statistical amplitude distribution of the signal to be amplified.

2. The amplifier according to claim 1,
wherein the main-amplifier signal corresponds to a signal to be amplified, and wherein the auxiliary-amplifier signal corresponds to the signal peaks of the signal to be amplified.

3. The amplifier according to claim 1,
wherein the main-amplifier signal and the auxiliary-amplifier signal are phase shifted.

4. The amplifier according to claim 1,
wherein the signal-generating device is configured to generate the main-amplifier signal and the auxiliary-amplifier signal by modulation and/or from digital data to be transmitted.

5. The amplifier according to claim 1,
wherein the signal-generating device includes a modulator or control transmitter.

6. The amplifier according to claim 1,
wherein the amplifier further contains a bias-current generating device, and wherein the bias-current generating device is configured to generate bias-currents of the main-amplifier circuit and the auxiliary-amplifier circuit.

7. The amplifier according to claim 6,
wherein the control device is configured to control the bias-current generating device.

8. The amplifier according to claim 6,
wherein the control device is configured to adjust the bias-currents of the main-amplifier circuit and the auxiliary-amplifier circuit in an efficiency-optimizing manner on the basis of statistical advance information relating to the signal to be amplified.

9. The amplifier according to claim 1,
wherein the control device is configured to maximize a mean efficiency over a totality of transmission symbols to be transmitted.

10. The amplifier according to claim 3, wherein the main-amplifier signal and the auxiliary-amplifier signal are phase shifted by 90°.

* * * * *